(12) United States Patent
Watanabe et al.

(10) Patent No.: US 11,538,704 B2
(45) Date of Patent: Dec. 27, 2022

(54) PROCESSING METHOD OF WORKPIECE

(71) Applicant: DISCO CORPORATION, Tokyo (JP)

(72) Inventors: Yoshio Watanabe, Tokyo (JP);
Hiroyuki Takahashi, Tokyo (JP);
Kentaro Wada, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 119 days.

(21) Appl. No.: 17/024,153

(22) Filed: Sep. 17, 2020

(65) Prior Publication Data
US 2021/0090926 A1    Mar. 25, 2021

(30) Foreign Application Priority Data

Sep. 19, 2019   (JP) .............................. JP2019-170578

(51) Int. Cl.
*H01L 21/677*   (2006.01)
*H01L 21/3065*   (2006.01)
(Continued)

(52) U.S. Cl.
CPC .. *H01L 21/67739* (2013.01); *H01J 37/32743* (2013.01); *H01J 37/32788* (2013.01); *H01J 37/32816* (2013.01); *H01L 21/3065* (2013.01); *H01L 21/6831* (2013.01); *H01J 2237/186* (2013.01); *H01J 2237/334* (2013.01)

(58) Field of Classification Search
CPC ........... H01J 2237/334; H01J 37/32743; H01J 37/32788; H01J 37/32816; H01J 2237/186; H01J 37/32477; H01J 37/32715; H01J 37/32733; H01L 21/3065; H01L 21/67739; H01L 21/6831; H01L 21/6838;
(Continued)

(56) References Cited

U.S. PATENT DOCUMENTS

| 2005/0036267 A1 | 2/2005 | Savas et al. |
| 2013/0098873 A1* | 4/2013 | Ramaswamy .... H01J 37/32541 |
| | | 156/345.38 |

(Continued)

FOREIGN PATENT DOCUMENTS

| DE | 102018211608 A1 | 1/2019 |
| JP | 08236601 A | 9/1996 |

(Continued)

OTHER PUBLICATIONS

German Office Action issued in co-pending German Patent Application No. 10 2020 211 724.1, dated Apr. 20, 2022.

*Primary Examiner* — Lan Vinh
(74) *Attorney, Agent, or Firm* — Greer Burns & Crain, Ltd.

(57) ABSTRACT

A processing method of a workpiece in which the workpiece with a plate shape is processed by using a vacuum chamber is provided. In the processing method of a workpiece, a negative pressure is caused to act on a holding surface from a suction path, and suction holding of the workpiece is executed by a chuck table. Then, the gas pressure in the vacuum chamber is reduced to at least 50 Pa and at most 5000 Pa. Then, while the suction holding of the workpiece is executed, an inert gas in a plasma state is supplied to the workpiece, and voltages are applied to electrodes disposed in the chuck table to execute electrostatic adhesion of the workpiece by the chuck table. Then, a processing gas in a plasma state is supplied, and dry etching of the workpiece is executed.

9 Claims, 11 Drawing Sheets

(51) Int. Cl.
*H01L 21/683* (2006.01)
*H01J 37/32* (2006.01)

(58) Field of Classification Search
CPC ............... H01L 21/78; H01L 21/67069; H01L 21/6836; H01L 2221/68327
USPC ............ 438/706, 710, 714, 716; 156/345.23, 156/345.51, 345.54
See application file for complete search history.

(56) References Cited

U.S. PATENT DOCUMENTS

| | | | |
|---|---|---|---|
| 2013/0153147 A1* | 6/2013 | Senzaki | .............. H01L 21/6831 361/234 |
| 2017/0229490 A1 | 8/2017 | Zhang et al. | |
| 2017/0345781 A1* | 11/2017 | Harikai | ............. H01L 21/32136 |
| 2019/0019712 A1 | 1/2019 | Chito et al. | |
| 2019/0111547 A1 | 4/2019 | Sekiya | |

FOREIGN PATENT DOCUMENTS

| | | |
|---|---|---|
| JP | 2007165743 A | 6/2007 |
| JP | 2007311462 A | 11/2007 |

* cited by examiner

PROCESSING METHOD OF WORKPIECE

BACKGROUND OF THE INVENTION

Field of the Invention

The present invention relates to a processing method of a workpiece.

Description of the Related Art

There is known a plasma etching technique in which etching is executed for a plate-shaped workpiece typified by a semiconductor device wafer obtained by forming devices on a surface of a silicon substrate or the like, by using a gas in a plasma state. In this plasma etching technique, a vacuum chamber is used, and an unnecessary gas (atmospheric air and so forth) inside the vacuum chamber is removed. Then, the state is made in which the inside of the vacuum chamber is filled with only a gas used for various kinds of treatment including the etching, and a gas pressure equal to or lower than 1000 Pa at which plasma can be generated is set. Thereafter, the workpiece is processed by the plasma (for example, refer to Japanese Patent Laid-open No. 2007-311462 and Japanese Patent Laid-open No. Hei 8-236601).

SUMMARY OF THE INVENTION

If control to return the space in the vacuum chamber to the atmospheric pressure or set the space to a vacuum state is executed when the workpiece is carried in and carried out to and from the vacuum chamber, the time taken for the carrying-in and carrying-out becomes longer according to the time taken for the control. Therefore, an anterior chamber in which the gas pressure of the internal space becomes equal to or lower than a predetermined gas pressure is set in front of a door of the vacuum chamber in many cases. Due to the setting of the anterior chamber, a workpiece can be carried in and carried out to and from the anterior chamber concurrently with etching in the vacuum chamber. Therefore, the adjustment range of the gas pressure in the vacuum chamber can be set smaller, and the time taken for adjustment of the gas pressure can be reduced. However, there is a problem that the apparatus becomes large due to the setting of the anterior chamber.

Further, normally a chuck table of an electrostatic adhesion type is used in the vacuum chamber. However, there is a problem that, if a gas exists in the vacuum chamber when a workpiece is placed on the chuck table, the gas readily remains (enters) between the workpiece and the chuck table even when electrostatic adhesion is caused. The intermediary of this gas causes a possibility that it becomes impossible for the workpiece to release high heat applied in etching through the chuck table.

Thus, an object of the present invention is to provide a processing method of a workpiece by which the workpiece can release high heat applied in etching while increase in the size of an apparatus is suppressed.

In accordance with an aspect of the present invention, there is provided a processing method of a workpiece in which the workpiece with a plate shape is processed by a gas in a plasma state by using a vacuum chamber that partitions the inside from atmospheric air. The processing method includes a carrying-in step of carrying in the workpiece from a door for carrying-in/out on the vacuum chamber and placing the workpiece over a holding surface of a chuck table in the vacuum chamber, a vacuum holding step of causing a negative pressure to act from a suction path that connects to the holding surface of the chuck table and executing suction holding of the workpiece by the chuck table after execution of the carrying-in step, and a pressure reduction step of closing the door and evacuating an atmosphere in the vacuum chamber to reduce a gas pressure in the vacuum chamber to at least 50 Pa and at most 5000 Pa at which low-pressure plasma is allowed to be realized and the suction holding of the workpiece by the chuck table is possible after execution of the vacuum holding step. The processing method also includes an electrostatic adhesion step of, while sucking the workpiece by the chuck table, supplying an inert gas in a plasma state to the workpiece and applying voltages to electrodes disposed in the chuck table, to execute electrostatic adhesion of the workpiece by the chuck table after execution of the pressure reduction step, a processing step of supplying a processing gas in a plasma state to the workpiece held by the chuck table and executing dry etching of the workpiece after execution of the electrostatic adhesion step, and an electrostatic adhesion stop step of stopping the voltage application to the electrodes of the chuck table while supplying the inert gas in the plasma state to the workpiece after execution of the processing step. The processing method also includes a door opening step of opening the door after the inert gas is supplied to the vacuum chamber and the gas pressure of the inside of the vacuum chamber is adjusted to an atmospheric pressure or higher and a workpiece carrying-out step of stopping the negative pressure caused to act from the suction path and causing the workpiece to break away from the holding surface to carry out the workpiece from the vacuum chamber after execution of the door opening step.

In the above-described aspect of the present invention, the gas that has come into the plasma state outside the vacuum chamber may be supplied to the workpiece in the electrostatic adhesion step, the processing step, or the electrostatic adhesion stop step.

Further, in the above-described aspect of the present invention, the gas that has come into the plasma state inside the vacuum chamber may be supplied to the workpiece in the electrostatic adhesion step, the processing step, or the electrostatic adhesion stop step.

Moreover, in the above-described aspect of the present invention, the workpiece may configure a frame unit in which the workpiece is supported by a resin tape in an opening of an annular frame, and may be held by the holding surface of the chuck table with the intermediary of the resin tape.

According to the aspect of the present invention, the workpiece is allowed to release high heat applied in etching while increase in the size of an apparatus is suppressed.

The above and other objects, features and advantages of the present invention and the manner of realizing them will become more apparent, and the invention itself will best be understood from a study of the following description and appended claims with reference to the attached drawings showing preferred embodiments of the invention.

DETAILED DESCRIPTION OF THE PREFERRED EMBODIMENTS

Modes (embodiments) for carrying out the present invention will be described in detail with reference to the drawings. The present invention is not limited by contents described in the following embodiments. Further, in constituent elements described below, what can be easily envisaged by those skilled in the art and what are substantially the same are included. Moreover, configurations described below can be combined as appropriate. In addition, various kinds of omission, replacement, or change of configurations can be executed without departing from the gist of the present invention.

First Embodiment

Figure 1:
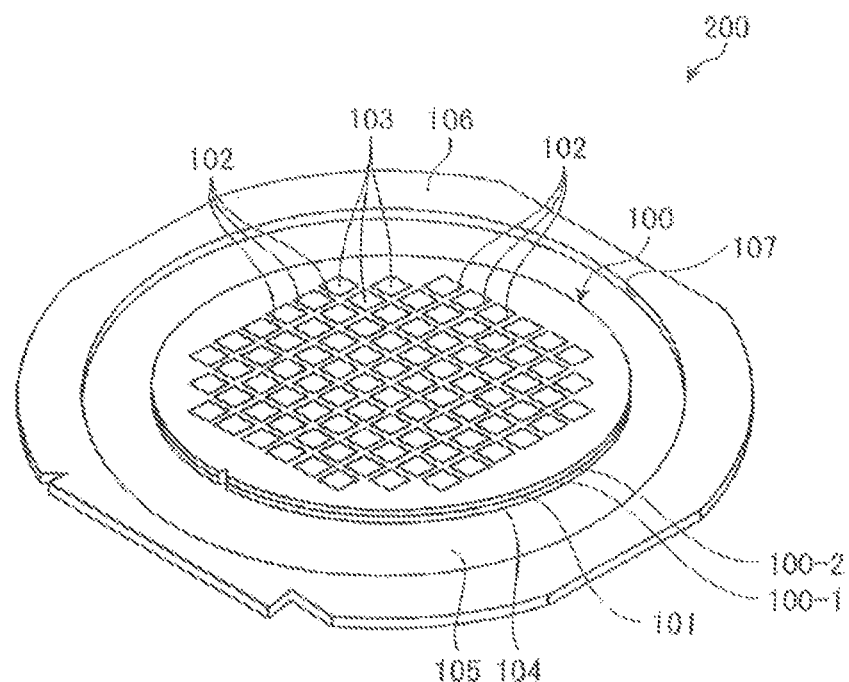
FIG. 1 is a perspective view depicting a workpiece that is a processing target of a processing method of a workpiece according to a first embodiment.
Figure 2:
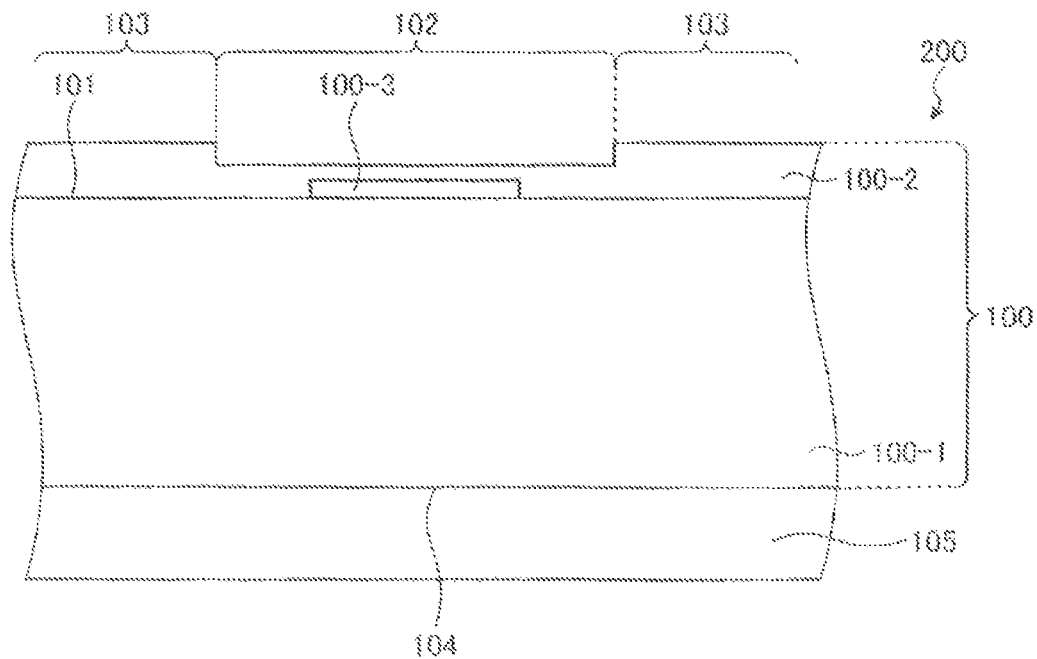
FIG. 2 is a sectional view depicting the workpiece in FIG. 1.

A processing method of a workpiece according to a first embodiment of the present invention will be described based on drawings. FIG. 1 is a perspective view depicting a workpiece 100 that is a processing target of the processing method of a workpiece according to the first embodiment. FIG. 2 is a sectional view depicting the workpiece 100 in FIG. 1. As depicted in FIG. 1, the workpiece 100 is a circular-disc-shaped wafer such as a semiconductor wafer or optical device wafer containing silicon, sapphire, silicon carbide (SiC), gallium arsenide, or the like as a base material 100-1, for example. Devices 103 are formed in regions on a front surface 101 of the workpiece 100 segmented by plural planned dividing lines 102 formed in a lattice manner.

Moreover, a functional layer 100-2 is stacked on the front surface 101 of the base material 100-1 of the workpiece 100. The functional layer 100-2 includes a low dielectric constant insulator coat (hereinafter, referred to as Low-k film) formed of an inorganic-based film containing SiOF, BSG (SiOB), or the like or an organic-based film containing a polymer such as a polyimide-based or parylene-based polymer, and an electrical conductor film including an electrically-conductive metal. The Low-k film is stacked on the electrical conductor film to form the devices 103. The electrical conductor film forms a circuit of the devices 103. For this reason, the devices 103 include the Low-k films mutually stacked and the electrical conductor film stacked between the Low-k films. The functional layer 100-2 of the planned dividing lines 102 includes the Low-k film but does not include the electrical conductor film except a test element group (TEG) 100-3. The TEG 100-3 is an element for evaluation for finding any problem in design or in manufacturing that occurs in the device 103.

A resin tape 105 is stuck to a back surface 104 on a side opposite to the front surface 101 of the workpiece 100, and an annular frame 106 is mounted on the outer edge part of the resin tape 105. Due to this, the workpiece 100 configures a frame unit 200 in which the workpiece 100 is supported by the resin tape 105 in an opening 107 of the annular frame 106. In the present invention, the workpiece 100 is not limited thereto and may be a plate-shaped object such as a rectangular package substrate, ceramic plate, or glass plate having plural devices sealed by a resin.

Here, the resin tape 105 may be what is called a resin sheet that does not have an adhesive layer on the side to which the side of the back surface 104 of the workpiece 100 is stuck, or may be what is called an adhesive tape having an adhesive layer on the side to which the side of the back surface 104 of the workpiece 100 is stuck.

Figure 3:
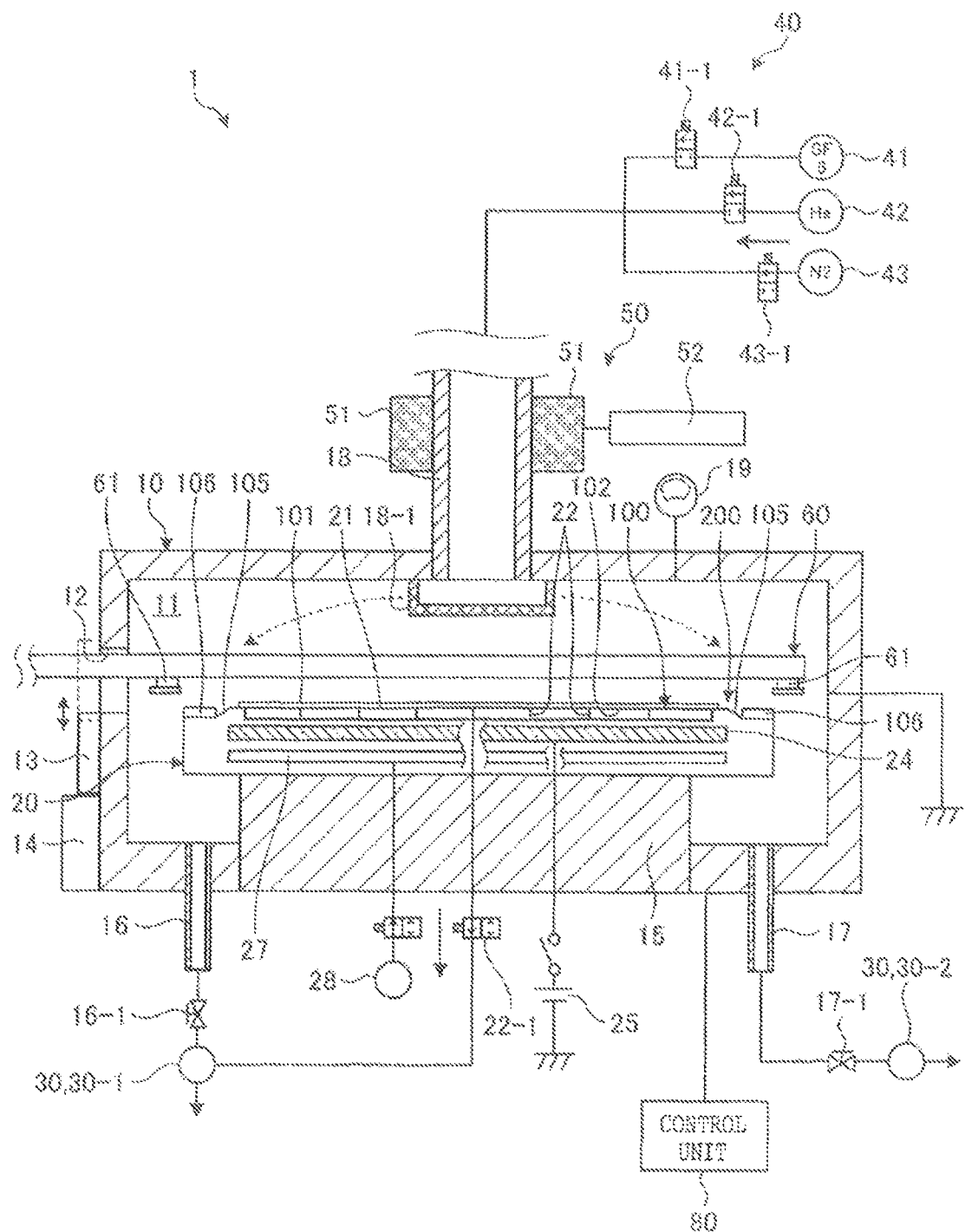
FIG. 3 is a sectional view depicting an etching processing apparatus that executes the processing method of a workpiece according to the first embodiment.

FIG. 3 is a sectional view depicting an etching processing apparatus 1 that executes the processing method of a workpiece according to the first embodiment. The etching processing apparatus 1 is an apparatus that executes plasma etching for the workpiece 100. As depicted in FIG. 3, the etching processing apparatus 1 includes a vacuum chamber 10, a chuck table 20, a suction source 30, a gas supply source 40, a turning-to-plasma unit 50, a carrying-in/out unit 60, and a control unit 80. In FIG. 3, a mask 302 (see FIG. 8) formed on the side of the front surface 101 of the workpiece 100 is omitted. Further, the mask 302 is similarly omitted in FIG. 9, FIG. 10, FIG. 12, and FIG. 13 to be described later.

The vacuum chamber 10 is a casing that partitions the inside from the atmospheric air and, as depicted in FIG. 3, includes an internal space 11, a carrying-in/out port 12, a door 13, a door actuating unit 14, a placement pedestal 15, a first gas evacuation path 16, a second gas evacuation path 17, a gas supply path 18, and a pressure gauge 19. The vacuum chamber 10 (casing) is grounded.

The internal space 11 is a space formed inside the vacuum chamber 10 through being partitioned from the atmospheric air. The carrying-in/out port 12 is a through-hole that is formed on a lateral side of the vacuum chamber 10 and allows the atmospheric air and the internal space 11 to communicate with each other. The carrying-in/out port 12 functions as a path of carrying-in of the workpiece 100 to the internal space 11 and carrying-out of the workpiece 100 from the internal space 11.

The door 13 is used in carrying-in and carrying-out and is set near the carrying-in/out port 12 movably between a closing position at which the door 13 covers the carrying-in/out port 12 and cuts off the communication between atmospheric air and the internal space 11 through the carrying-in/out port 12 and an opening position at which the door 13 evacuated from the closing position is located and permits the communication between the atmospheric air and the internal space 11 through the carrying-in/out port 12. The door actuating unit 14 moves the door 13 between the closing position and the opening position.

The placement pedestal 15 is set in a central region of the internal space 11 in the width direction on the lower side of the internal space 11. The first gas evacuation path 16 and the second gas evacuation path 17 are separately set at positions that sandwich the placement pedestal 15 under the internal space 11, and allow communication between the internal space 11 and suction sources 30-1 and 30-2 through valves 16-1 and 17-1 that can each be switched between an opening position and a closing position. In the first embodiment, the first gas evacuation path 16 evacuates an inert gas corresponding to the amount of supply of the inert gas from an inert gas supply source 42 or 43, and the second gas evacuation path 17 evacuates a processing gas corresponding to the amount of supply of the processing gas from a processing gas supply source 41.

The gas supply path 18 is set in a central region of the internal space 11 in the width direction on the upper side of the internal space 11 and opposed to the placement pedestal 15. The gas supply path 18 allows communication between the internal space 11 and the gas supply source 40. The gas supply path 18 includes a dispersing component 18-1 set to cover an opening on the side of the internal space 11. In the first embodiment, for example, the dispersing component 18-1 is formed into the circular cylindrical shape in which plural through-holes are made and disperses a gas in a plasma state supplied from the side of the gas supply source 40 to a holding surface 21 of the chuck table 20 in the internal space 11.

The pressure gauge 19 is a measurement system that is set on the casing of the vacuum chamber 10 to be oriented toward the internal space 11 and measures the gas pressure of the internal space 11. The etching processing apparatus 1 can adjust opening and closing of the valves 16-1, 17-1, 41-1, 42-1, and 43-1 as appropriate based on the gas pressure of the internal space 11 measured by the pressure gauge 19, and so forth.

The chuck table 20 is disposed to be housed in the vacuum chamber 10. Specifically, the chuck table 20 is set on the placement pedestal 15 set in the internal space 11. As depicted in FIG. 3, the chuck table 20 includes the holding surface 21, a suction path 22, electrodes 24, a direct-current power supply 25, a cooling fluid path 27, and a cooling fluid source 28. The main body part of the chuck table 20 is formed of an insulating material having electrical insulation property.

The holding surface 21 is a flat surface formed on the upper side of the chuck table 20 and holds the side of the back surface 104 of the workpiece 100 with the intermediary of the resin tape 105. The suction path 22 is formed inside the chuck table 20 and allows communication between the holding surface 21 and the suction source 30-1 through a valve 22-1 that can be switched between an opening position and a closing position.

When the valve 22-1 is switched to the opened state, a negative pressure acts on the holding surface 21 of the chuck table 20 from the suction source 30-1. When the gas pressure of the internal space 11 is equal to or higher than 50 Pa, a sufficient differential pressure is generated between the negative pressure that acts on the holding surface 21 and the gas pressure of the internal space 11. Therefore, the chuck table 20 comes into a state of being capable of suction holding (vacuum holding) of the workpiece 100 by the holding surface 21 with sufficient strength as a result of the negative pressure that acts on the holding surface 21. On the other hand, when the gas pressure of the internal space 11 is lower than 50 Pa, the differential pressure between the negative pressure that acts on the holding surface 21 and the gas pressure of the internal space 11 becomes low. Therefore, the chuck table 20 comes into a state of being capable of suction holding (vacuum holding) of the workpiece 100 by the holding surface 21 only with a weak force even by the negative pressure that acts on the holding surface 21.

The plural electrodes 24 are disposed to be buried inside the chuck table 20, and the direct-current power supply 25 is electrically connected to each of them. The direct-current power supply 25 can apply direct-current voltages different from each other to the plural electrodes 24. When the direct-current voltages are applied by the direct-current power supply 25 and a potential difference is generated between the electrodes 24, a predetermined electric field is generated to cover the holding surface 21 of the chuck table 20. By generating this predetermined electric field, the electrodes 24 enable electrostatic adhesion of the workpiece 100 by the holding surface 21 of the chuck table 20. In addition, the electrodes 24 allow a gas turned to plasma to be favorably drawn to the workpiece 100 held by the holding surface 21 of the chuck table 20.

Further, when the application of the direct-current voltages from the direct-current power supply 25 is stopped and the potential difference generated between the electrodes 24 is eliminated, the predetermined electric field generated to cover the holding surface 21 of the chuck table 20 disappears. The electrodes 24 cancel the state in which the electrostatic adhesion of the workpiece 100 is executed by the holding surface 21 of the chuck table 20, by causing this predetermined electric field to disappear.

The cooling fluid path 27 is formed inside the chuck table 20 and communicates with the cooling fluid source 28. The cooling fluid source 28 supplies a cooling fluid to the cooling fluid path 27. When the cooling fluid supplied by the cooling fluid source 28 flows inside the cooling fluid path 27, the cooling fluid path 27 cools the holding surface 21 of the chuck table 20. The cooling fluid path 27 can cool the workpiece 100 held by the holding surface 21 of the chuck table 20 by cooling the holding surface 21 of the chuck table 20.

As depicted in FIG. 3, in the first embodiment, the suction source 30 includes the suction source 30-1 to which the first gas evacuation path 16 and the suction path 22 are connected and the suction source 30-2 to which the second gas evacuation path 17 is connected. Although the suction source 30 includes the two suction sources 30-1 and 30-2 in the first embodiment, the suction source 30 is not limited to this form in the present invention. The suction source 30 may be consolidated to one suction source or may be divided into three suction sources.

In the first embodiment, a vacuum pump that executes vacuuming of the internal space 11 is favorably used as the suction source 30. Here, the vacuum is what is called a reduced-pressure state and, for example, is a low vacuum at which the gas pressure of the internal space 11 of the vacuum chamber 10 is approximately $10^2$ Pa to $10^5$ Pa lower than the atmospheric pressure, a medium vacuum at approximately $10^{-1}$ Pa to $10^2$ Pa, or the like. As the vacuum pump favorably used for the suction source 30, what can execute vacuuming of the internal space 11 to a gas pressure at which low-pressure plasma can be realized while introducing an inert gas is used. For example, a dry pump, oil rotary pump, or the like that realizes the low vacuum, and a turbomolecular pump, oil diffusion pump, or the like that can realize the medium vacuum are used in combination. Here, that low-pressure plasma can be realized indicates that it is possible to turn the processing gas or the inert gas to plasma in the vacuum (reduced-pressure state).

As depicted in FIG. 3, the gas supply source 40 includes the processing gas supply source 41 and the inert gas supply sources 42 and 43. The processing gas supply source 41 is connected to the gas supply path 18 through the valve 41-1 that can be switched between an opening position and a closing position. The inert gas supply sources 42 and 43 are connected to the gas supply path 18 through the valves 42-1 and 43-1 that can each be switched between an opening position and a closing position.

In the first embodiment, the processing gas supply source 41 supplies a sulfur hexafluoride ($SF_6$) gas as the processing gas. However, the processing gas supply source 41 is not limited thereto in the present invention and may supply any compound or mixture gas as the processing gas as long as the gas is a compound or mixture gas with which it is possible to process the workpiece 100 by etching through turning the gas to plasma. Here, the fact that it is possible to process the workpiece 100 by etching indicates that etching of the workpiece 100 can be executed at a predetermined rate or higher.

In the first embodiment, the inert gas supply sources 42 and 43 supply a helium (He) gas and a nitrogen ($N_2$) gas, respectively, as the inert gas. However, the inert gas supply sources 42 and 43 are not limited thereto in the present invention and may supply any compound or mixture gas as the inert gas as long as the gas is a compound or mixture gas that is inert to the workpiece 100 even when being turned to plasma. Here, the fact that the gas is inert to the workpiece 100 indicates that the gas causes etching of the workpiece 100 only at a rate lower than a predetermined rate and whatever chemical reaction caused on the workpiece 100 proceeds only at a reaction rate lower than a predetermined reaction rate. Besides, the inert gas supply sources 42 and 43 may supply an argon (Ar) gas or clean dry air (CDA) as the inert gas, for example. Further, in the processing method of a workpiece according to the first embodiment to be described later, only the inert gas supply source 43 is used. However, the processing method is not limited thereto in the present invention and may use only the inert gas supply source 42 or may use the inert gas supply sources 42 and 43 in combination.

In the first embodiment, the inert gas supplied from the inert gas supply source 43 is used for a vacuum break of the internal space 11 of the vacuum chamber 10. Therefore, the valve 43-1 has a structure in which an unillustrated slow vent valve about which the amount of supply of the inert gas in the opened state is suppressed and an unillustrated vent valve about which the amount of supply of the inert gas in the opened state is large are disposed in parallel.

The turning-to-plasma unit 50 is a mechanism that turns, to plasma, the processing gas and the inert gas that pass through the gas supply path 18 from the gas supply source 40 and are supplied toward the holding surface 21 of the chuck table 20 in the internal space 11, inside the gas supply path 18. As depicted in FIG. 3, the turning-to-plasma unit 50 includes a pair of turning-to-plasma electrodes 51 and a high-frequency power supply 52. In the first embodiment, the turning-to-plasma unit 50 makes it possible to supply a gas that has come into a plasma state through being turned to plasma in the gas supply path 18 outside the vacuum chamber 10 to the workpiece 100 carried in to the internal space 11 of the vacuum chamber 10.

The turning-to-plasma electrodes 51 are disposed to sandwich the gas supply path 18 and be opposed to each other. The high-frequency power supply 52 can apply a high-frequency alternating-current voltage between the pair of turning-to-plasma electrodes 51. When the high-frequency alternating-current voltage is applied to the pair of turning-to-plasma electrodes 51 by the high-frequency power supply 52, the pair of turning-to-plasma electrodes 51 can turn the gas that passes through the gas supply path 18 to plasma (radicalization, ionization, or the like).

As depicted in FIG. 3, the carrying-in/out unit 60 moves along the opening direction of the carrying-in/out port 12, with the carrying-in/out port 12 being part of the movement path, between a carrying-in/out position above the holding surface 21 of the chuck table 20 in the internal space 11 of the vacuum chamber 10 and an evacuation position that is a position outside the vacuum chamber 10 and at which the carrying-in/out unit 60 evacuated from the carrying-in/out position is positioned. The carrying-in/out unit 60 has gripping parts 61 that grip the workpiece 100 toward the lower side, i.e., on the surface on the side opposed to the holding surface 21 of the chuck table 20 at the carrying-in/out position. The gripping parts 61 are disposed at two places in the example of the first embodiment depicted in FIG. 3. However, the gripping part 61 is not limited thereto in the present invention, and may be disposed at one place or may be disposed at three or more places as long as the workpiece 100 can be gripped. As the carrying-in/out unit 60, a robot hand is exemplified as what is suitable in the first embodiment.

The control unit 80 controls each of the constituent elements of the etching processing apparatus 1 and causes the etching processing apparatus 1 to execute each operation relating to etching for the workpiece 100. In the first embodiment, the control unit 80 includes a computer system. The control unit 80 has an arithmetic processing apparatus having a microprocessor such as a central processing unit (CPU), a storing apparatus having a memory such as a read only memory (ROM) or a random access memory (RAM), and an input-output interface apparatus. The arithmetic processing apparatus executes arithmetic processing according to a computer program stored in the storing apparatus and outputs a control signal for controlling the etching processing apparatus 1 to the respective constituent elements of the etching processing apparatus 1 through the input-output interface apparatus.

Figure 4:
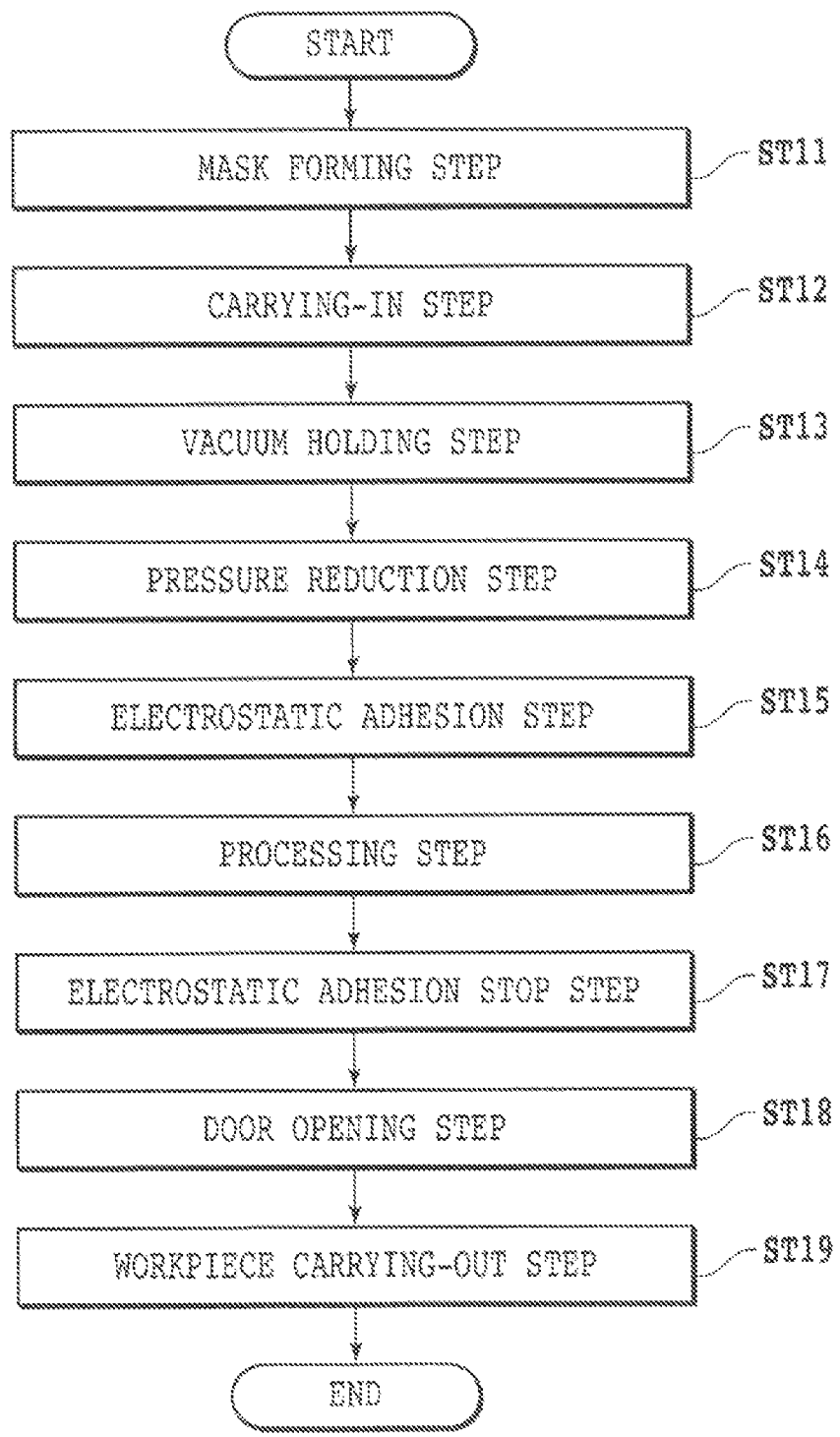
FIG. 4 is a flowchart depicting treatment of the processing method of a workpiece according to the first embodiment.

FIG. 4 is a flowchart depicting treatment of the processing method of a workpiece according to the first embodiment. The processing method of a workpiece according to the first embodiment is executed by using the etching processing apparatus 1 substantially. As depicted in FIG. 4, the processing method includes a mask forming step ST11, a carrying-in step ST12, a vacuum holding step ST13, a pressure reduction step ST14, an electrostatic adhesion step ST15, a processing step ST16, an electrostatic adhesion stop step ST17, a door opening step ST18, and a workpiece carrying-out step ST19. The processing method of a workpiece according to the first embodiment is a method in which the vacuum chamber 10 that partitions the inside from the atmospheric air in the etching processing apparatus 1 is used and the plate-shaped workpiece 100 housed inside is processed by a processing gas 502 (see FIG. 10) in a plasma state. In the processing method of a workpiece, in the first embodiment, the mask 302 is formed on the front surface 101 of the workpiece 100, and plasma etching is executed from the side of the front surface 101. However, the processing method is not limited thereto in the present invention. The mask 302 may be formed on the back surface 104 of the workpiece 100, and plasma etching may be executed from the side of the back surface 104.

Figure 5:
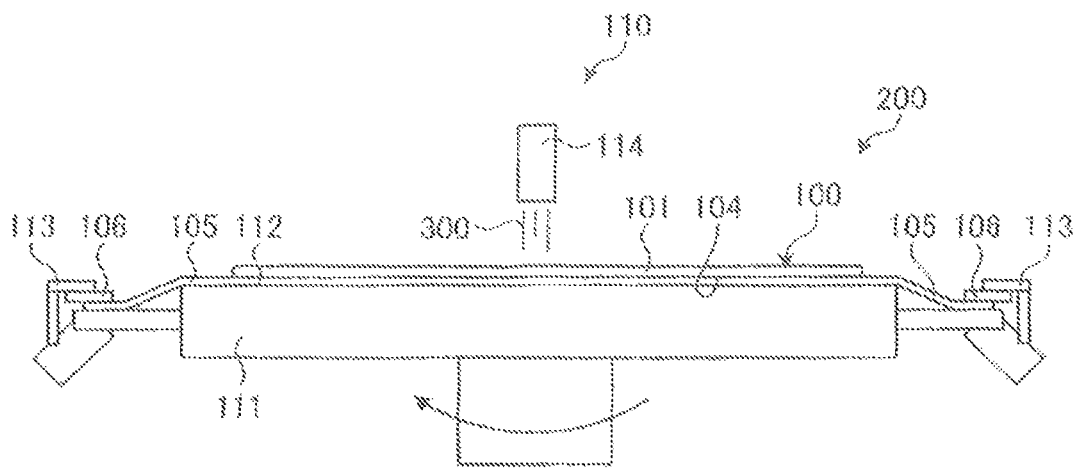
FIG. 5 is a sectional view for explaining the state in which a resin is formed in a mask forming step in FIG. 4.
Figure 6:
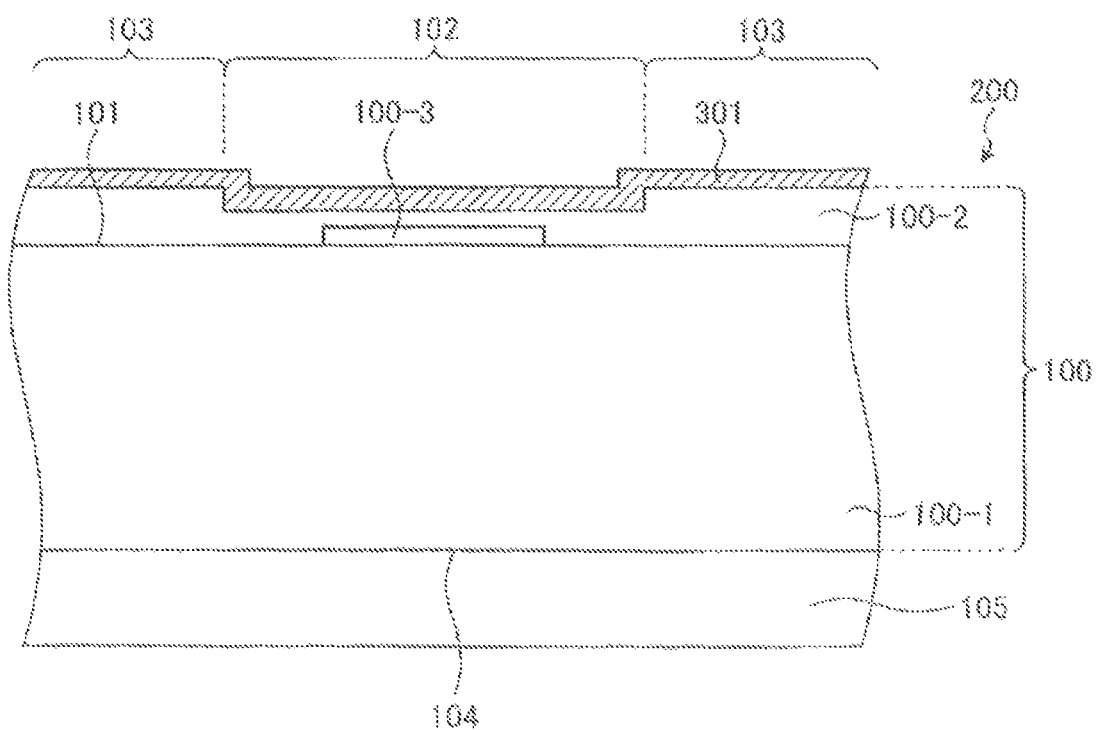
FIG. 6 is a sectional view depicting the workpiece after the front surface side of the workpiece is coated by the resin in the mask forming step in FIG. 4.
Figure 7:
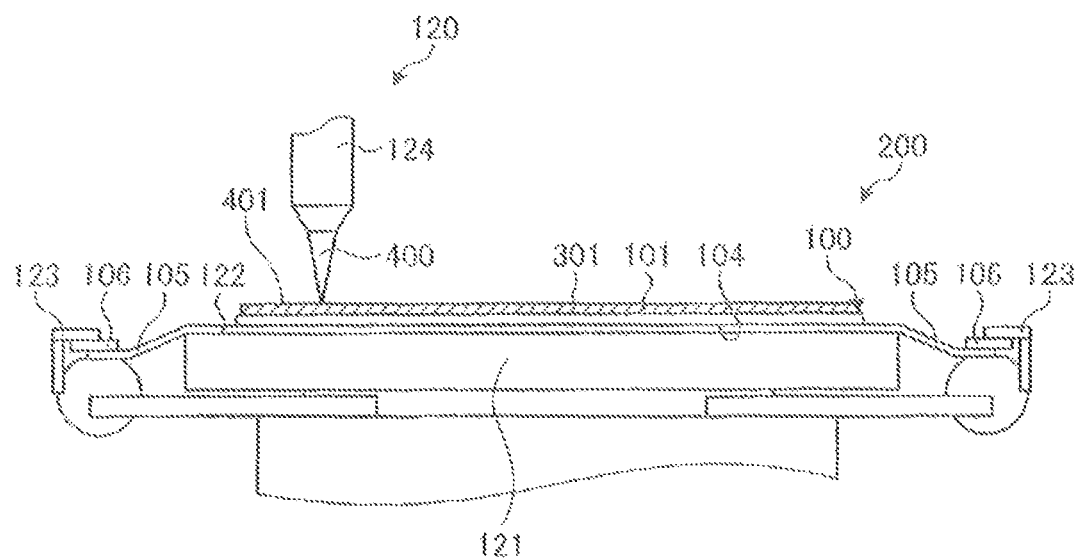
FIG. 7 is a sectional view for explaining the state in which a laser processed groove is formed in the mask forming step in FIG. 4.
Figure 8:
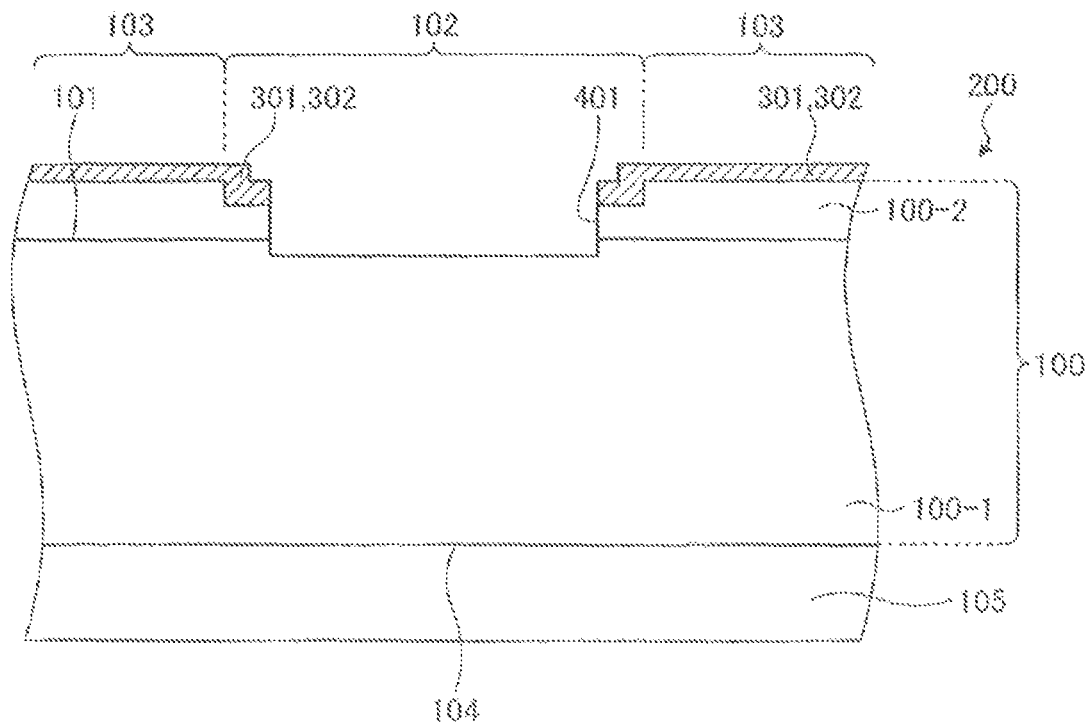
FIG. 8 is a sectional view depicting the workpiece after a mask is formed on the front surface side of the workpiece in the mask forming step of FIG. 4.

FIG. 5 is a sectional view for explaining the state in which a resin 301 is formed in the mask forming step ST11 for the workpiece 100 in FIG. 1. FIG. 6 is a sectional view depicting the workpiece 100 after the side of the front surface 101 of the workpiece 100 is coated by the resin 301 in the mask forming step ST11. FIG. 7 is a sectional view for explaining the state in which a laser processed groove 401 is formed in the mask forming step ST11. FIG. 8 is a sectional view depicting the workpiece 100 after the mask 302 is formed on the side of the front surface 101 of the workpiece 100 in the mask forming step ST11.

The mask forming step ST11 is a step of forming the mask 302 that prevents etching in regions on the workpiece 100 for which etching is not executed by the processing method of a workpiece according to the first embodiment, as depicted in FIG. 5, FIG. 6, FIG. 7, and FIG. 8.

In the mask forming step ST11, first, as depicted in FIG. 5, a holding table 111 of a resin coating unit 110 holds the side of the back surface 104 of the workpiece 100 with the intermediary of the resin tape 105 by a holding surface 112, and clamp parts 113 of the resin coating unit 110 clamp the annular frame 106 mounted to the workpiece 100.

In the mask forming step ST11, next, a resin supply part 114 of the resin coating unit 110 supplies a liquid resin 300 by executing jetting, spraying, dropping, or the like of the liquid resin 300 toward the front surface 101 that is the exposed surface side of the workpiece 100 held by the holding surface 112. In addition, the holding table 111 is rotated around the axis center along the direction orthogonal to the holding surface 112. Thus, in the mask forming step ST11, a centrifugal force is given to the liquid resin 300 supplied over the front surface 101 of the workpiece 100 through the holding table 111 and the workpiece 100. By this centrifugal force, the liquid resin 300 is thinly spread over the whole of the front surface 101 of the workpiece 100, and the resin 301 with a thin film shape is formed over the front surface 101 of the workpiece 100 as depicted in FIG. 6.

Here, the liquid resin 300 may be what contains the resin 301 and has become an application liquid through dispersion of the resin 301 by a solvent having volatility or may be what mainly includes the water-soluble resin 301. As the resin 301, a material with strong chemical resistance against the processing gas 502 in a plasma state used in etching of the processing step ST16 to be described later is favorably used. For example, what is generally used for a mask such as resist of etching can favorably be used.

In the mask forming step ST11, two or more layers of the resin 301 with a thin film shape may be formed in an overlapped manner and, according to the kind of resin 301, the resin 301 formed over the front surface 101 of the workpiece 100 may be heated to be cured by using a heating apparatus that is not depicted in the diagram.

In the mask forming step ST11, after curing of the resin 301, as depicted in FIG. 7, a holding table 121 of a laser processing unit 120 holds the side of the back surface 104 of the workpiece 100 coated by the resin 301 with the intermediary of the resin tape 105 by a holding surface 122, and clamp parts 123 of the laser processing unit 120 clamp the annular frame 106 mounted to the workpiece 100 coated by the resin 301.

In the mask forming step ST11, next, alignment in which position adjustment is executed between the workpiece 100 over the holding table 121 and the position of irradiation with a laser beam 400 by a laser beam irradiation unit 124 of the laser processing unit 120 is fulfilled. Thereafter, the laser beam irradiation unit 124 executes irradiation with the laser beam 400 from the side of the front surface 101 along the planned dividing lines 102 and executes laser processing. Thus, the resin 301 on the planned dividing lines 102 is removed, and the laser processed grooves 401 are formed along the planned dividing lines 102 as depicted in FIG. 8.

In the mask forming step ST11, in the first embodiment, the laser processed grooves 401 are formed by removing the resin 301, the functional layer 100-2, and the TEG 100-3 on the planned dividing lines 102 and a surface layer of the base material 100-1. The laser processed grooves 401 expose the base material 100-1 of the workpiece 100 at the groove bottoms. Due to this, in the mask forming step ST11, as depicted in FIG. 8, the resin 301 on the devices 103 remains and the resin 301 on the planned dividing lines 102 is removed, so that the mask 302 including the resin 301 is formed. The workpiece 100 comes into state in which the base material 100-1 of the workpiece 100 is exposed at the groove bottoms of the laser processed grooves 401 and processing by etching is possible.

When the processing method of a workpiece is not being executed, the etching processing apparatus 1 opens or closes the valves 16-1 and 17-1 as appropriate and holds the internal space 11 of the vacuum chamber 10 at a vacuum state by the suction sources 30-1 and 30-2 through the first gas evacuation path 16 and the second gas evacuation path 17. Thus, the carrying-in step ST12 of the processing method of a workpiece according to the first embodiment is started in the state in which the internal space 11 of the vacuum chamber 10 is held at the vacuum state.

The carrying-in step ST12 is a step of carrying in the workpiece 100 from the door 13 for carrying-in/out on the vacuum chamber 10 and placing the workpiece 100 over the holding surface 21 of the chuck table 20 in the vacuum chamber 10 as depicted in FIG. 3.

Specifically, in the carrying-in step ST12, first, the vacuum state of the internal space 11 of the vacuum chamber 10 held at the start timing of the processing method of a workpiece is broken. Specifically, in the carrying-in step ST12, the control unit 80 switches the valves 16-1 and 17-1 to the closed state and switches the valve 43-1 to the opened state to thereby supply the inert gas from the inert gas supply source 43 to the internal space 11 of the vacuum chamber 10 and raise the gas pressure of the internal space 11 to the atmospheric pressure.

More specifically, in the carrying-in step ST12, the control unit 80 switches only the slow vent valve of the valve 43-1 to the opened state to raise the gas pressure of the internal space 11 from the vacuum state to approximately 1000 Pa comparatively slowly. Thereafter, the control unit 80 optionally sets time delay, switches the slow vent valve of the valve 43-1 to the closed state, and switches the vent valve to the opened state to quickly raise the gas pressure of the internal space 11 from approximately 1000 Pa to the atmospheric pressure (approximately 100000 Pa).

In the carrying-in step ST12, when the gas pressure of the internal space 11 has been raised to the atmospheric pressure, the control unit 80 temporarily switches the vent valve of the valve 43-1 to the closed state. Thereafter, in the carrying-in step ST12, the control unit 80 switches the vent valve of the valve 43-1 to the opened state as appropriate in order to hold a state of a slightly-positive pressure with respect to the atmospheric pressure.

In the carrying-in step ST12, after the gas pressure of the internal space 11 is raised to the atmospheric pressure, the vacuum chamber 10 is opened by moving the door 13 from the closing position to the opening position by the door actuating unit 14 to open the carrying-in/out port 12. In the carrying-in step ST12, simultaneously with opening the carrying-in/out port 12, the control unit 80 sets the vent valve of the valve 43-1 to the opened state and supplies the inert gas from the inert gas supply source 43 to the internal space 11 of the vacuum chamber 10. Thus, in execution of the subsequent treatment in the carrying-in step ST12, inflow of the atmospheric air from the carrying-in/out port 12 to the internal space 11 of the vacuum chamber 10 is prevented.

In the carrying-in step ST12, next, the carrying-in/out unit 60 that has gripped, at the evacuation position, the frame unit 200 including the workpiece 100 on which the mask 302 has been formed in the mask forming step ST11 moves from the evacuation position to the carrying-in/out position through passing through the opened carrying-in/out port 12 in the state in which the workpiece 100 after the mask forming step ST11 is gripped by the gripping parts 61. Thus, the workpiece 100 is carried in from the door 13 for carrying-in/out on the vacuum chamber 10.

In the carrying-in step ST12, after the workpiece 100 is carried in, the carrying-in/out unit 60 releases the gripped state of the workpiece 100 after the mask forming step ST11 by the gripping parts 61 at the carrying-in/out position and thereby places the workpiece 100 over the holding surface 21 of the chuck table 20 in the vacuum chamber 10. Due to this, in the carrying-in step ST12, the state is obtained in which the side of the resin tape 105 of the frame unit 200 including the workpiece 100 on which the mask 302 has been formed in the mask forming step ST11 is placed toward the holding surface 21 of the chuck table 20 as depicted in FIG. 3.

The vacuum holding step ST13 is a step of causing a negative pressure to act from the suction path 22 that connects to the holding surface 21 of the chuck table 20 and executing suction holding of the workpiece 100 by the chuck table 20, after the execution of the carrying-in step ST12, as depicted in FIG. 3.

Specifically, in the vacuum holding step ST13, the control unit 80 causes a negative pressure from the suction source 30-1 to act on the holding surface 21 through the suction path 22 by switching the valve 22-1 from the closed state to the opened state. Due to this, in the vacuum holding step ST13, the state is obtained in which the side of the resin tape 105 of the frame unit 200 including the workpiece 100 on which the mask 302 has been formed in the mask forming step ST11 is subjected to suction holding by the holding surface 21 of the chuck table 20 as depicted in FIG. 3.

Figure 9:
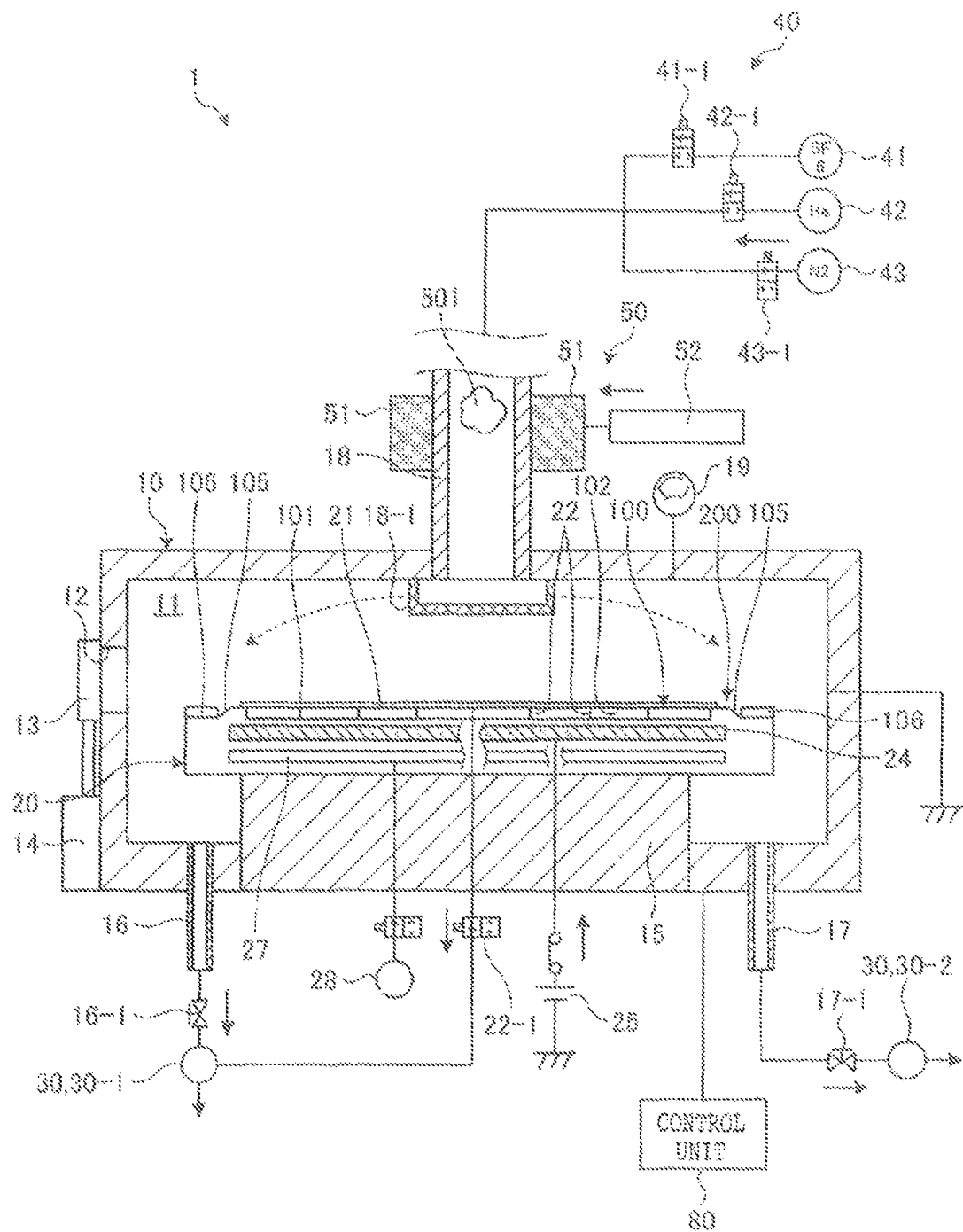
FIG. 9 is a sectional view for explaining a pressure reduction step and an electrostatic adhesion step in FIG. 4.

FIG. 9 is a sectional view for explaining the pressure reduction step ST14 and the electrostatic adhesion step ST15 in FIG. 4. The pressure reduction step ST14 is a step of, after the execution of the vacuum holding step ST13, closing the door 13 and evacuating the atmosphere in the vacuum chamber 10 to reduce the gas pressure in the vacuum chamber 10 to at least 50 Pa and at most 5000 Pa at which low-pressure plasma can be realized (that is, treatment by low-pressure plasma can be executed) and suction holding by the chuck table 20 is possible as depicted in FIG. 9.

In the pressure reduction step ST14, first, the carrying-in/out unit 60 inserted to the carrying-in/out position in the vacuum chamber 10 from the carrying-in/out port 12 in the carrying-in step ST12 is moved from the carrying-in/out position to the evacuation position through passing through the carrying-in/out port 12. In the pressure reduction step ST14, next, the vacuum chamber 10 is closed by moving the door 13 from the opening position to the closing position by the door actuating unit 14 and closing the carrying-in/out port 12.

In the pressure reduction step ST14, after the carrying-in/out port 12 is closed, the control unit 80 evacuates the atmosphere of the internal space 11 of the closed vacuum chamber 10 and executes vacuuming by switching the vent valve of the valve 43-1 to the closed state and switching at least either one of the valves 16-1 and 17-1 to the opened state. More specifically, in the pressure reduction step ST14, first, the pressure of the internal space 11 of the vacuum chamber 10 is reduced by the suction source 30, and the gas pressure of the internal space 11 of the vacuum chamber 10 is set to at least 50 Pa and at most 5000 Pa at which low-pressure plasma can be realized and suction holding of the workpiece 100 by the holding surface 21 of the chuck table 20 is possible, preferably at least 50 Pa and at most 1000 Pa.

The electrostatic adhesion step ST15 is a step of, after the execution of the pressure reduction step ST14, while sucking the workpiece 100 by the chuck table 20, supplying an inert gas 501 in a plasma state to the workpiece 100 and applying voltages to the electrodes 24 disposed in the chuck table 20 to execute electrostatic adhesion of the workpiece 100 by the chuck table 20 as depicted in FIG. 9.

The electrostatic adhesion step ST15 is executed in the state in which, under control by the control unit 80, suction holding of the workpiece 100 is executed on the holding surface 21 of the chuck table 20 and the gas pressure of the internal space 11 of the vacuum chamber 10 is kept at at least 50 Pa and at most 5000 Pa, preferably at least 50 Pa and at most 1000 Pa.

Specifically, in the electrostatic adhesion step ST15, first, the control unit 80 switches the valve 43-1 to the opened state to introduce an inert gas. In addition, the turning-to-plasma unit 50 applies a high-frequency alternating-current voltage between the pair of turning-to-plasma electrodes 51 by the high-frequency power supply 52. Thus, the inert gas that passes through the gas supply path 18 is turned to plasma. In the electrostatic adhesion step ST15, in the first embodiment, the inert gas 501 that has come into the plasma state in the gas supply path 18 outside the vacuum chamber 10 is supplied to the workpiece 100. In the electrostatic adhesion step ST15, by supplying the inert gas 501 in the plasma state to the workpiece 100 over the holding surface 21 of the chuck table 20 as above, the workpiece 100 over the holding surface 21 of the chuck table 20 is set to the state of being charged with static electricity by the inert gas 501 in the plasma state.

In the electrostatic adhesion step ST15, next, the chuck table 20 is subjected to control by the control unit 80, and the direct-current power supply 25 applies direct-current voltages different from each other to the electrodes 24 to generate a potential difference between the electrodes 24. Thus, the chuck table 20 generates a predetermined electric field in such a manner that the holding surface 21 of the chuck table 20 is covered. In the electrostatic adhesion step ST15, as above, the chuck table 20 generates the predetermined electric field in such a manner that the holding surface 21 of the chuck table 20 is covered, and thereby executes electrostatic adhesion of the workpiece 100 that has come into a state of being charged with static electricity.

When the electrostatic adhesion of the workpiece 100 is executed by the holding surface 21 in the state in which the gas pressure of the internal space 11 is lower than 50 Pa, the differential pressure between the gas pressure of the internal space 11 and the negative pressure caused to act on the holding surface 21 for the suction holding is low, and thus, it is impossible to sufficiently execute the suction holding of the workpiece 100 by the holding surface 21. Therefore, there is a possibility that the electrostatic adhesion is executed in the state in which the chuck table 20 and the workpiece 100 are not in tight contact with each other and have a gap therebetween. Further, when the electrostatic adhesion of the workpiece 100 is executed by the holding surface 21 in the state in which the gas pressure of the internal space 11 is higher than 5000 Pa, there is a possibility that a gas remains (enters) between the chuck table 20 and the workpiece 100, more specifically between the holding surface 21 of the chuck table 20 and the resin tape 105 stuck to the back surface 104 of the workpiece 100.

Thus, in the processing method of a workpiece according to the first embodiment, in the pressure reduction step ST14, the gas pressure of the internal space 11 is reduced while suction holding of the workpiece 100 by the holding surface 21 is kept until the gas pressure of the internal space 11 becomes at least 50 Pa and at most 5000 Pa, preferably at least 50 Pa and at most 1000 Pa, under control by the control unit 80. Due to this, in the processing method of a workpiece according to the first embodiment, in the vacuum holding step ST13 and the pressure reduction step ST14, the gas between the chuck table 20 and the workpiece 100 is evacuated while the tight contact between the chuck table 20 and the workpiece 100 is kept. In the processing method of a workpiece according to the first embodiment, under the state after the execution of the pressure reduction step ST14, the chuck table 20 is subjected to control by the control unit 80 and executes electrostatic adhesion of the workpiece 100 by the holding surface 21 in the electrostatic adhesion step ST15. Due to this, in the processing method of a workpiece according to the first embodiment, in the electrostatic adhesion step ST15 after the execution of the pressure reduction step ST14, the electrostatic adhesion of the workpiece 100 can be executed by the holding surface 21 in the state in which tight contact between the chuck table 20 and the workpiece 100 is sufficiently made and the remaining (entry) of the gas between the chuck table 20 and the workpiece 100 is reduced.

Figure 10:
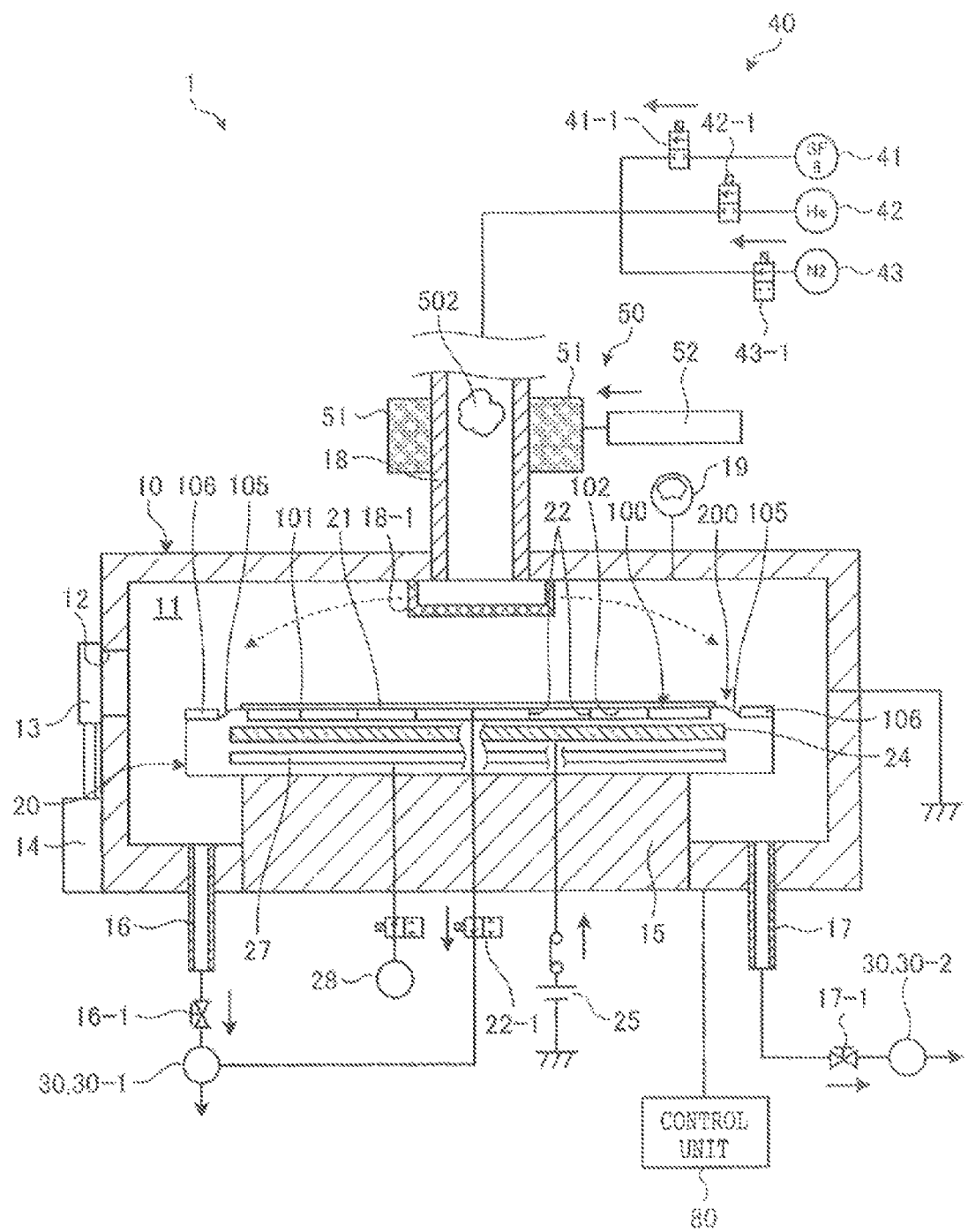
FIG. 10 is a sectional view for explaining a processing step in FIG. 4.
Figure 11:
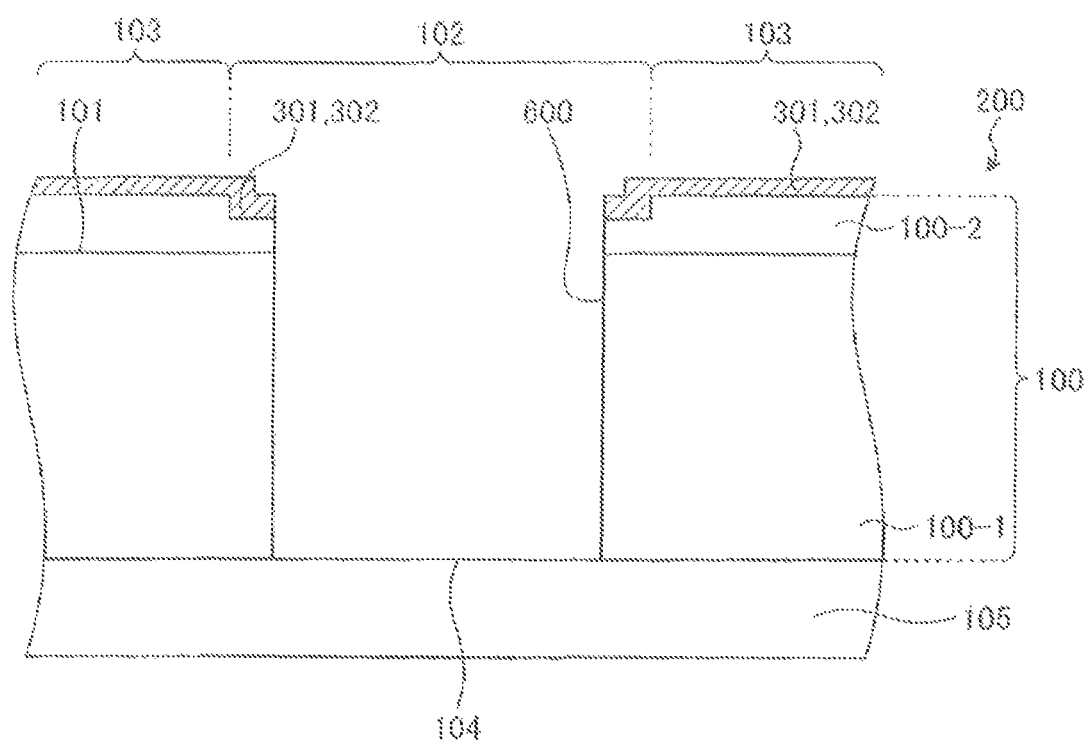
FIG. 11 is a sectional view depicting the workpiece that has gone through the processing step in FIG. 4.

FIG. 10 is a sectional view for explaining the processing step ST16 in FIG. 4. FIG. 11 is a sectional view depicting the workpiece 100 that has gone through the processing step ST16 in FIG. 4. The processing step ST16 is a step of supplying the processing gas 502 in a plasma state to the workpiece 100 held by the chuck table 20 and executing dry etching of the workpiece 100, after the execution of the electrostatic adhesion step ST15, as depicted in FIG. 10.

In the processing step ST16, continuously with the electrostatic adhesion step ST15, the control unit 80 keeps the valve 43-1 at the opened state and keeps the state in which the high-frequency alternating-current voltage is applied between the pair of turning-to-plasma electrodes 51 by the high-frequency power supply 52, to keep on supplying the inert gas 501 that has come into the plasma state in the gas supply path 18 to the workpiece 100.

Specifically, in the processing step ST16, first, by control by the control unit 80, the internal space 11 of the vacuum chamber 10 is further evacuated to execute vacuuming and set the gas pressure of the internal space 11 to 50 Pa or lower. Therefore, in the processing step ST16, the differential pressure between the negative pressure that acts on the holding surface 21 and the gas pressure of the internal space 11 becomes low. Therefore, the suction holding of the workpiece 100 by the holding surface 21 of the chuck table 20 is substantially released, which produces the state in which the workpiece 100 is held by the holding surface 21 of the chuck table 20 substantially by the electrostatic adhesion. In the processing step ST16, while the suction holding of the workpiece 100 by the holding surface 21 of the chuck table 20 is substantially released, the control unit 80 may switch the valve 22-1 from the opened state to the closed state and temporarily stop the action of the negative pressure on the holding surface 21 through the suction path 22 from the suction source 30-1.

In the processing step ST16, after the gas pressure of the internal space 11 is set to 50 Pa or lower, the control unit 80 switches the valve 41-1 to the opened state and introduces the processing gas. Thus, in the processing step ST16, the processing gas is turned to plasma while passing through the gas supply path 18 because the turning-to-plasma unit 50 is continuously applying the high-frequency alternating-current voltage between the pair of turning-to-plasma electrodes 51 by the high-frequency power supply 52. In the processing step ST16, in the first embodiment, the processing gas 502 that has come into the plasma state in the gas supply path 18 corresponding to the outside of the vacuum chamber 10 is supplied to the workpiece 100. Further, in the processing step ST16, the chuck table 20 that is subjected to control by the control unit 80 and holds the workpiece 100 by electrostatic adhesion draws the processing gas 502 in the plasma state to the workpiece 100 by the predetermined electric field generated around the holding surface 21. In the processing step ST16, by supplying the processing gas 502 in the plasma state to the workpiece 100 over the holding surface 21 of the chuck table 20 as above, dry etching of the workpiece 100 over the holding surface 21 of the chuck table 20 is executed by the processing gas 502 in the plasma state.

In the processing step ST16, the cooling fluid source 28 supplies a cooling fluid to the cooling fluid path 27 concurrently with the execution of the dry etching of the workpiece 100. Thus, the holding surface 21 of the chuck table 20 is cooled, and heat generated due to the dry etching of the workpiece 100 held by the holding surface 21 of the chuck table 20 is released through the chuck table 20.

In the processing step ST16, because the mask 302 is formed on the devices 103 of the workpiece 100, the part of the devices 103 of the workpiece 100 is protected from the etching by the processing gas 502 in the plasma state, by the mask 302. On the other hand, in the processing step ST16, because the resin 301 has been removed over the planned dividing lines 102 of the workpiece 100 and the state in which etching is possible is produced, the processing gas 502 in the plasma state is drawn to the base material 100-1 at the part of the planned dividing lines 102 of the workpiece 100 and etches and removes the base material 100-1 at the part of the planned dividing lines 102. In the processing step ST16, when the etching is executed for a predetermined period of time under control by the control unit 80, as depicted in FIG. 11, the base material 100-1 at the part of the planned dividing lines 102 of the workpiece 100 is completely removed and etching processed grooves 600 that separate the adjacent devices 103 are formed at the part of the planned dividing lines 102, resulting in the state in which the adjacent devices 103 are supported separately from each other by the resin tape 105 stuck to the back surface 104. In the processing step ST16, the control unit 80 switches the valve 41-1 to the closed state and stops the introduction of the processing gas to end the dry etching.

Figure 12:
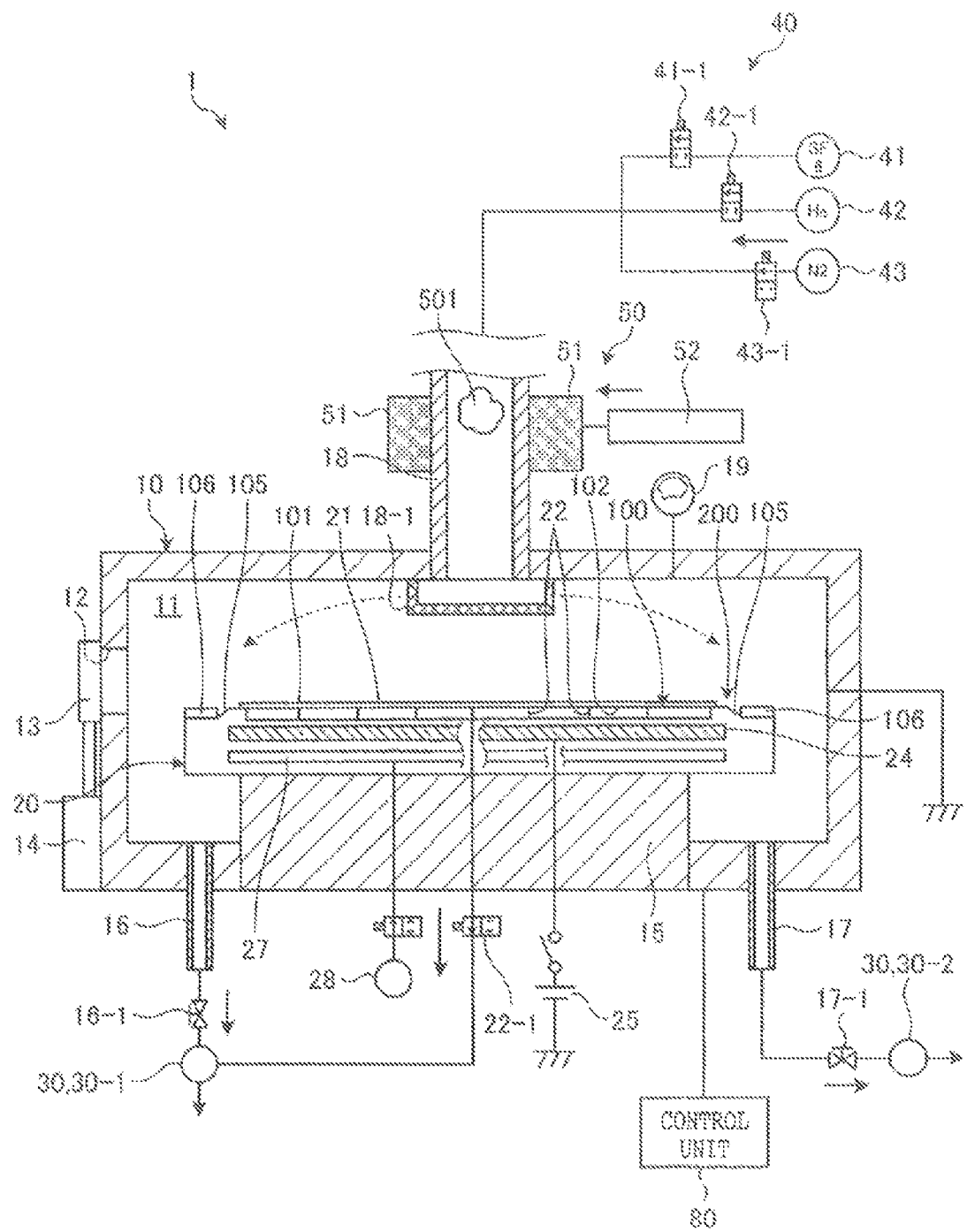
FIG. 12 is a sectional view for explaining an electrostatic adhesion stop step in FIG. 4.

FIG. 12 is a sectional view for explaining the electrostatic adhesion stop step ST17 in FIG. 4. The electrostatic adhesion stop step ST17 is a step of stopping the voltage application to the electrodes 24 of the chuck table 20 while supplying the inert gas 501 in the plasma state to the workpiece 100, after the execution of the processing step ST16, as depicted in FIG. 12.

The electrostatic adhesion stop step ST17 is started in the state in which, continuously with the electrostatic adhesion step ST15 and the processing step ST16, the control unit 80 keeps the valve 43-1 at the opened state and keeps the state in which the high-frequency alternating-current voltage is applied between the pair of turning-to-plasma electrodes 51 by the high-frequency power supply 52, to keep on supplying the inert gas 501 that has come into the plasma state in the gas supply path 18 to the workpiece 100.

Specifically, in the electrostatic adhesion stop step ST17, first, the inert gas is introduced to the internal space 11 of the vacuum chamber 10 and the gas pressure of the internal space 11 is set to at least 50 Pa and at most 5000 Pa, preferably at least 50 Pa and at most 1000 Pa, by control by the control unit 80. Due to this, in the electrostatic adhesion stop step ST17, the differential pressure between the negative pressure that acts on the holding surface 21 and the gas pressure of the internal space 11 becomes sufficiently high. Therefore, suction holding of the workpiece 100 is executed again by the holding surface 21 of the chuck table 20 while the state in which the electrostatic adhesion of the workpiece 100 is executed by the holding surface 21 of the chuck table 20 is kept.

In the electrostatic adhesion stop step ST17, next, in the state in which the suction holding and the electrostatic adhesion of the workpiece 100 are executed by the holding surface 21 of the chuck table 20, the direct-current power supply 25 is subjected to control by the control unit 80 and stops the application of the direct-current voltages to the electrodes 24 to eliminate the potential difference generated between the electrodes 24. Thus, the predetermined electric field generated to cover the holding surface 21 of the chuck table 20 is made to disappear. Due to this, in the electrostatic adhesion stop step ST17, the electrostatic adhesion of the workpiece 100 by the holding surface 21 of the chuck table 20 is stopped and released.

In the electrostatic adhesion stop step ST17, after the electrostatic adhesion of the workpiece 100 by the holding surface 21 of the chuck table 20 is stopped and released, the control unit 80 stops the application of the high-frequency alternating-current voltage between the pair of turning-to-plasma electrodes 51 from the high-frequency power supply 52 of the turning-to-plasma unit 50. Thus, in the electrostatic adhesion stop step ST17, the supply of the inert gas 501 in the plasma state to the workpiece 100 is stopped.

Figure 13:
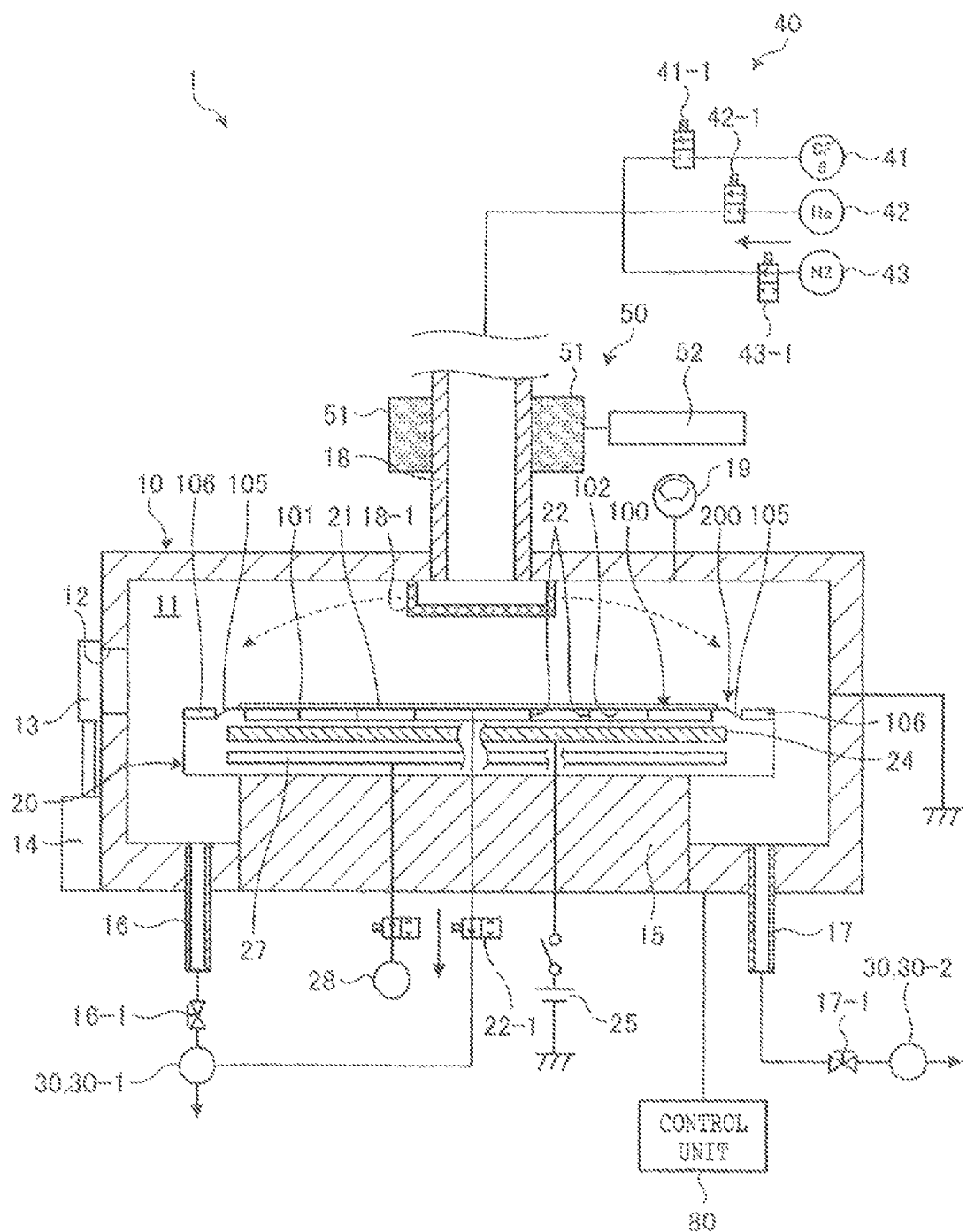
FIG. 13 is a sectional view for explaining a door opening step in FIG. 4.

FIG. 13 is a sectional view for explaining the door opening step ST18 in FIG. 4. The door opening step ST18 is a step of opening the door 13 after the inert gas is supplied to the vacuum chamber 10 and the gas pressure of the inside of the vacuum chamber 10 is adjusted to the atmospheric pressure or higher, as depicted in FIG. 13.

Specifically, in the door opening step ST18, first, the vacuum state of the internal space 11 of the vacuum chamber 10 after the execution of the electrostatic adhesion stop step ST17 is broken by supplying the inert gas to the vacuum chamber 10 by a method similar to the carrying-in step ST12. Thus, in the door opening step ST18, the gas pressure of the internal space 11 of the vacuum chamber 10 is adjusted to the atmospheric pressure or higher.

In the door opening step ST18, next, by a method similar to the carrying-in step ST12, the vacuum chamber 10 is opened by moving the door 13 from the closing position to the opening position by the door actuating unit 14 and opening the carrying-in/out port 12.

The workpiece carrying-out step ST19 is a step of stopping the negative pressure caused to act from the suction path 22 and causing the workpiece 100 to break away from the holding surface 21 to carry out the workpiece 100 from the vacuum chamber 10 after the execution of the door opening step ST18.

Specifically, in the workpiece carrying-out step ST19, first, the control unit 80 stops the action of the negative pressure on the holding surface 21 through the suction path 22 from the suction source 30-1 by switching the valve 22-1 from the opened state to the closed state. Thus, in the workpiece carrying-out step ST19, the suction holding of the frame unit 200 including the workpiece 100 in which the etching processed grooves 600 have been formed at the part of the planned dividing lines 102 through the processing step ST16 by the holding surface 21 of the chuck table 20 is released, which produces the state in which the frame unit 200 including the workpiece 100 has broken away from the holding surface 21.

In the workpiece carrying-out step ST19, next, the carrying-in/out unit 60 moves from the evacuation position to the carrying-in/out position through passing through the carrying-in/out port 12 opened in the door opening step ST18 in the state in which nothing is gripped by the gripping parts 61. Then, in the workpiece carrying-out step ST19, the carrying-in/out unit 60 grips the frame unit 200 including the workpiece 100 that has broken away from the holding surface 21 by the gripping parts 61 at the carrying-in/out position, and moves from the carrying-in/out position to the evacuation position through passing through the carrying-in/out port 12 in the state in which the frame unit 200 including the workpiece 100 is gripped. In the workpiece carrying-out step ST19, as above, the carrying-in/out unit 60 carries out the frame unit 200 including the workpiece 100 in which the etching processed grooves 600 have been formed at the part of the planned dividing lines 102 through the processing step ST16, from the door 13 for carrying-in/out on the vacuum chamber 10.

As above, in the processing method of a workpiece according to the first embodiment, the gas pressure of the internal space 11 is reduced while suction holding of the workpiece 100 by the holding surface 21 is kept until the gas pressure of the internal space 11 becomes at least 50 Pa and at most 5000 Pa, preferably at least 50 Pa and at most 1000 Pa. Then, under this state, electrostatic adhesion of the workpiece 100 is executed by the holding surface 21. Due to this, in the processing method of a workpiece according to the first embodiment, the electrostatic adhesion of the workpiece 100 can be executed by the holding surface 21 in the state in which the chuck table 20 and the workpiece 100 are sufficiently brought into tight contact with each other and the remaining (entry) of the gas between the chuck table 20 and the workpiece 100 is reduced. This allows the processing method of a workpiece according to the first embodiment to provide operation and effect that the workpiece 100 can efficiently release high heat applied in the etching through the chuck table 20.

Further, in the processing method of a workpiece according to the first embodiment, what is called an anterior chamber is not disposed in the etching processing apparatus 1. Therefore, by using the characteristic that the gas pressure of the internal space 11 becomes close to the atmospheric pressure when the workpiece 100 is carried in or out, the electrostatic adhesion is executed under the state in which the gas pressure of the internal space 11 has been reduced while suction holding by a vacuum is kept. As above, the processing method of a workpiece according to the first embodiment provides operation and effect that increase in the size of the apparatus can be suppressed because the etching processing apparatus 1 does not need what is called the anterior chamber.

Moreover, in the processing method of a workpiece according to the first embodiment, the gas that has come into the plasma state outside the vacuum chamber 10 is supplied to the workpiece 100 in the electrostatic adhesion step ST15, the processing step ST16, or the electrostatic adhesion stop step ST17. That is, the processing method of a workpiece according to the first embodiment is executed with what is called a remote plasma system. Thus, the processing method of a workpiece according to the first embodiment allows the surroundings of the vacuum chamber 10 of the etching processing apparatus 1 to be more compact and therefore provides operation and effect that increase in the size of the apparatus can be further suppressed.

Furthermore, in the processing method of a workpiece according to the first embodiment, the workpiece 100 configures the frame unit 200 in which the workpiece 100 is supported by the resin tape 105 in the opening 107 of the annular frame 106, and is held by the holding surface 21 of the chuck table 20 with the intermediary of the resin tape 105. Thus, the processing method of a workpiece according to the first embodiment provides operation and effect that it is possible to keep the state in which the adjacent devices 103 are supported separately from each other by the resin tape 105 stuck to the back surface 104 when the part of the planned dividing lines 102 of the workpiece 100 is completely removed and the etching processed grooves 600 are formed by the processing step ST16.

In the processing method of a workpiece according to the first embodiment, instead of forming the etching processed grooves 600, a heat affected layer of the surface layer of the processed grooves 401 may be removed by plasma etching, and the workpiece 100 may be divided by executing dicing with a cutting blade. In this case, the processing method of a workpiece according to the first embodiment provides operation and effect that the flexural strength of the workpiece 100 can be improved because the heat affected layer is removed by the plasma etching.

Second Embodiment

Figure 14:
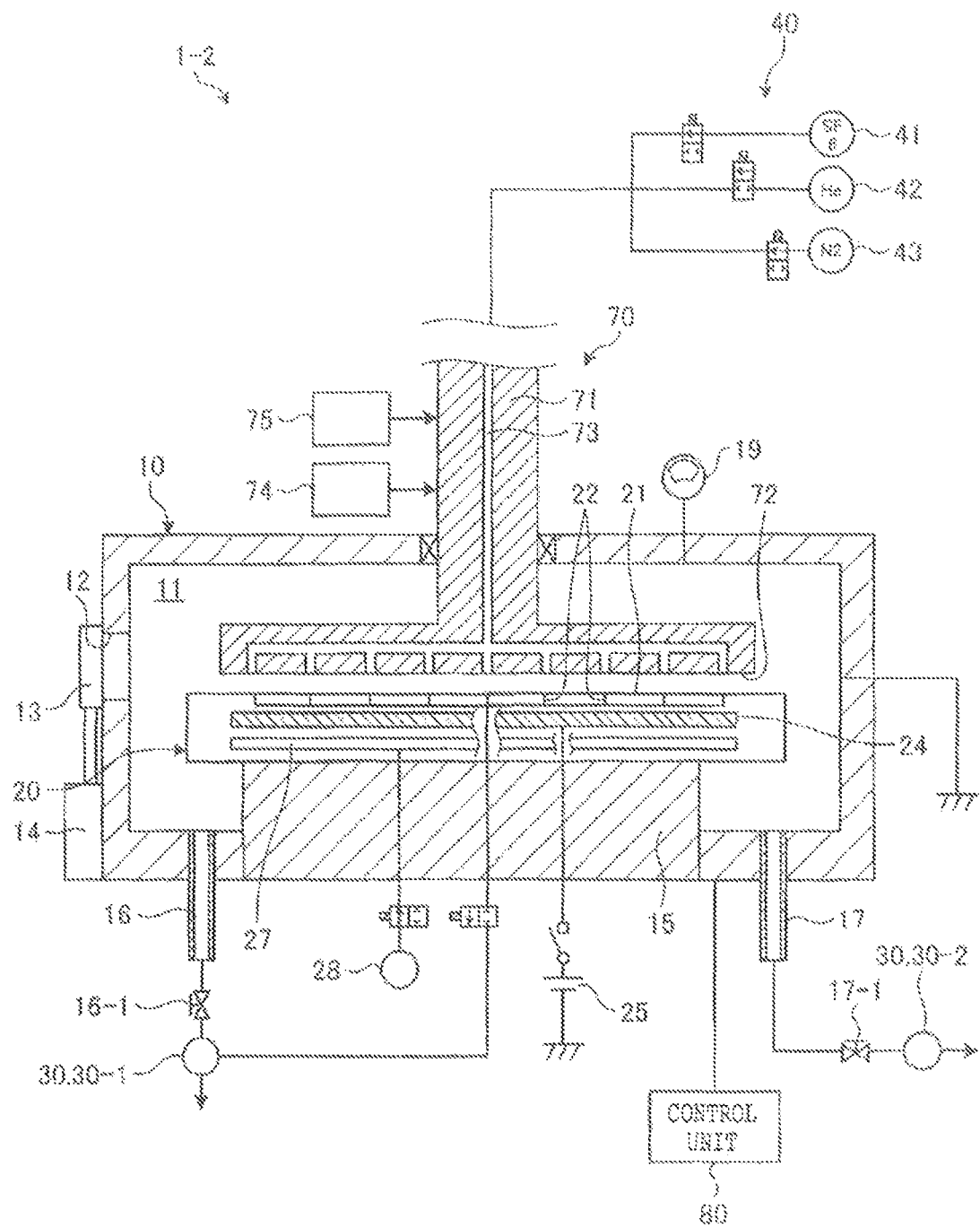
FIG. 14 is a sectional view depicting an etching processing apparatus that executes a processing method of a workpiece according to a second embodiment.

A processing method of a workpiece according to a second embodiment of the present invention will be described based on a drawing. FIG. 14 is a sectional view depicting an etching processing apparatus 1-2 that executes the processing method of a workpiece according to the second embodiment. In FIG. 14, the same part as the first embodiment is given the same numeral and description thereof is omitted.

As depicted in FIG. 14, the etching processing apparatus 1-2 includes a plasma-state gas supply unit 70 instead of the gas supply path 18 and the turning-to-plasma unit 50 in the etching processing apparatus 1, and the other configuration is similar to the etching processing apparatus 1. In FIG. 14, the carrying-in/out unit 60 is omitted.

The plasma-state gas supply unit 70 includes an upper electrode 71, a high-frequency power supply 74, and a raising-lowering drive part 75 as depicted in FIG. 14.

The upper electrode 71 is set in a central region of the internal space 11 in the width direction on the upper side of the internal space 11 in such a manner as to penetrate the casing of the vacuum chamber 10 and be opposed to the placement pedestal 15. The upper electrode 71 includes an electrode surface 72 and a gas supply path 73. The electrode surface 72 is formed in the surface of such a direction as to be opposed to the placement pedestal 15 in the upper electrode 71. The electrode surface 72 is opposed to the holding surface 21 of the chuck table 20 set on the placement pedestal 15 in the vertical direction. The gas supply path 73 is formed inside the upper electrode 71 and allows the electrode surface 72 and the gas supply source 40 to communicate with each other.

The high-frequency power supply 74 can apply a high-frequency alternating-current voltage between the upper electrode 71 and the electrodes 24 in the chuck table 20 that are lower electrodes. When the high-frequency alternating-current voltage is applied by the high-frequency power supply 74, the upper electrode 71 and the electrodes 24 can turn the gas supplied between the electrode surface 72 of the upper electrode 71 and the holding surface 21 of the chuck table 20 to plasma through radicalization, ionization, or the like.

The raising-lowering drive part 75 is a mechanism that is disposed to connect to the upper electrode 71 and raises and lowers the upper electrode 71 relative to the vacuum chamber 10 in the vertical direction. The raising-lowering drive part 75 moves the upper electrode 71 between an evacuation position with which the electrode surface 72 of the upper electrode 71 is sufficiently separated from the holding surface 21 of the chuck table 20 in the vertical direction and the carrying-in/out unit 60 is allowed to be accepted into the carrying-in/out position and a turning-to-plasma position with which the electrode surface 72 of the upper electrode 71 is brought sufficiently close to the holding surface 21 of the chuck table 20 and the gas supplied to between the electrode surface 72 and the holding surface 21 can be turned to plasma.

In the second embodiment, the plasma-state gas supply unit 70 makes it possible to supply the gas that has come into a plasma state through being turned to plasma between the electrode surface 72 of the upper electrode 71 corresponding to the inside of the vacuum chamber 10 and the holding surface 21 of the chuck table 20 to the workpiece 100 held by the holding surface 21 of the chuck table 20.

The processing method of a workpiece according to the second embodiment is executed by the etching processing apparatus 1-2 instead of the etching processing apparatus 1 of the processing method of a workpiece according to the first embodiment. Thus, in the processing method of a workpiece according to the second embodiment, in the electrostatic adhesion step ST15, the processing step ST16, and the electrostatic adhesion stop step ST17 in the processing method of a workpiece according to the first embodiment, the gas that has come into the plasma state inside the vacuum chamber 10 due to the plasma-state gas supply unit 70 is supplied to the workpiece 100 instead of supplying, to the workpiece 100, the gas that has come into the plasma state outside the vacuum chamber 10 due to the gas supply path 18 and the turning-to-plasma unit 50. The other configuration is similar to the first embodiment.

The processing method of a workpiece according to the second embodiment has the above configuration and is similar to the processing method of a workpiece according to the first embodiment except that the gas that has come into the plasma state inside the vacuum chamber 10 is supplied to the workpiece 100. Therefore, the processing method of a workpiece according to the second embodiment has operations and effects similar to those of the processing method of a workpiece according to the first embodiment.

In the processing method of a workpiece according to the second embodiment, the gas that has come into the plasma state inside the vacuum chamber 10 is supplied to the workpiece 100 in the electrostatic adhesion step ST15, the processing step ST16, or the electrostatic adhesion stop step ST17. Thus, the processing method of a workpiece according to the second embodiment provides operation and effect that etching of the workpiece 100 can efficiently be executed because the gas that has come into the plasma state inside the vacuum chamber 10 can immediately be used for the etching of the workpiece 100 that exists at a position close to the position at which the gas has come into the plasma state.

The present invention is not limited to the above-described embodiments. That is, the present invention can be implemented with various modifications without departing from the gist of the present invention.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A processing method of a workpiece in which the workpiece with a plate shape is processed by a gas in a plasma state by using a vacuum chamber that partitions inside from atmospheric air, the processing method comprising:
   a carrying-in step of carrying in the workpiece from a door for carrying-in/out on the vacuum chamber and placing the workpiece over a holding surface of a chuck table in the vacuum chamber;
   a vacuum holding step of causing a negative pressure to act from a suction path that connects to the holding surface of the chuck table and executing suction holding of the workpiece by the chuck table, after execution of the carrying-in step;
   a pressure reduction step of closing the door and evacuating an atmosphere in the vacuum chamber to reduce a gas pressure in the vacuum chamber to at least 50 Pa and at most 5000 Pa at which low-pressure plasma is allowed to be realized and the suction holding of the workpiece by the chuck table is possible, after execution of the vacuum holding step;
   an electrostatic adhesion step of, while sucking the workpiece by the chuck table, supplying an inert gas in a plasma state to the workpiece and applying voltages to electrodes disposed in the chuck table, to execute electrostatic adhesion of the workpiece by the chuck table after execution of the pressure reduction step;
   a processing step of supplying a processing gas in a plasma state to the workpiece held by the chuck table and executing dry etching of the workpiece after execution of the electrostatic adhesion step;
   an electrostatic adhesion stop step of stopping the voltage application to the electrodes of the chuck table while supplying the inert gas in the plasma state to the workpiece, after execution of the processing step;
   a door opening step of opening the door after the inert gas is supplied to the vacuum chamber and the gas pressure of inside of the vacuum chamber is adjusted to an atmospheric pressure or higher; and
   a workpiece carrying-out step of stopping the negative pressure caused to act from the suction path and causing the workpiece to break away from the holding surface to carry out the workpiece from the vacuum chamber after execution of the door opening step.

2. The processing method of a workpiece according to claim 1, wherein the workpiece is configured as a frame unit in which the workpiece is supported by a resin tape in an opening of an annular frame, and is held by the holding surface of the chuck table with intermediary of the resin tape.

3. The processing method of a workpiece according to claim 1, wherein the suction path is formed within the chuck table.

4. The processing method of a workpiece according to claim 1, wherein the gas that has come into the plasma state outside the vacuum chamber is supplied to the workpiece in the electrostatic adhesion step, the processing step, or the electrostatic adhesion stop step.

5. The processing method of a workpiece according to claim 4, wherein the workpiece is configured as a frame unit in which the workpiece is supported by a resin tape in an opening of an annular frame, and is held by the holding surface of the chuck table with intermediary of the resin tape.

6. The processing method of a workpiece according to claim 1, wherein the gas that has come into the plasma state inside the vacuum chamber is supplied to the workpiece in the electrostatic adhesion step, the processing step, or the electrostatic adhesion stop step.

7. The processing method of a workpiece according to claim 6, wherein the workpiece is configured as a frame unit in which the workpiece is supported by a resin tape in an opening of an annular frame, and is held by the holding surface of the chuck table with intermediary of the resin tape.

8. The processing method of a workpiece according to claim 1, wherein the suction path is formed within the chuck table and is configured and arranged for communication between the holding surface of the chuck table and a suction source.

9. The processing method of a workpiece according to claim 8, wherein the suction path includes a valve between the holding surface of the chuck table and the suction source.

* * * * *